(12) United States Patent
Tsai et al.

(10) Patent No.: US 8,890,611 B2
(45) Date of Patent: Nov. 18, 2014

(54) OPERATIONAL AMPLIFIER CIRCUITS

(75) Inventors: Hung-Chieh Tsai, Tainan (TW); Chi-Lun Lo, Yangmei Township, Taoyuan County (TW); Chen-Yen Ho, New Taipei (TW); Yu-Hsin Lin, Taipei (TW)

(73) Assignee: MediaTek Inc., Hsin-Chu (TW)

( * ) Notice: Subject to any disclaimer, the term of this patent is extended or adjusted under 35 U.S.C. 154(b) by 42 days.

(21) Appl. No.: 13/612,784

(22) Filed: Sep. 12, 2012

(65) Prior Publication Data
US 2013/0200953 A1 Aug. 8, 2013

Related U.S. Application Data

(60) Provisional application No. 61/596,356, filed on Feb. 8, 2012.

(51) Int. Cl.
| | |
|---|---|
| H03F 3/45 | (2006.01) |
| H03F 3/193 | (2006.01) |
| H03F 1/14 | (2006.01) |
| H03F 1/32 | (2006.01) |
| H03F 3/30 | (2006.01) |

(52) U.S. Cl.
CPC ............ *H03F 3/45076* (2013.01); *H03F 3/193* (2013.01); *H03F 2203/45526* (2013.01); *H03F 3/45188* (2013.01); *H03F 1/14* (2013.01); *H03F 2203/45626* (2013.01); *H03F 1/3211* (2013.01); *H03F 3/3023* (2013.01); *H03F 3/45* (2013.01)

USPC .......................................................... 330/255

(58) Field of Classification Search
CPC ........................................................ H03F 3/45
USPC ................... 330/252–261; 327/563
See application file for complete search history.

(56) References Cited

U.S. PATENT DOCUMENTS 5,216,380 A * 6/1993 Carbou ......................... 330/253

OTHER PUBLICATIONS

Ouzounov, S., et al.; "A 1.2V 121-Mode CT Delta Sigma Modulator for Wireless Receivers in 90nm CMOS;" IEEE International Solid State Circuits Conference; Session 13; 2007; pp. 242-244.

* cited by examiner

*Primary Examiner* — Robert Pascal
*Assistant Examiner* — Khiem Nguyen
(74) *Attorney, Agent, or Firm* — McClure, Qualey & Rodack, LLP (57) ABSTRACT

An operational amplifier circuit includes a first stage amplifier circuit, a second stage amplifier circuit and a first feedforward circuit. The first stage amplifier circuit is coupled to a first input node for receiving a first input signal and amplifying the first input signal to generate a first amplified signal. The second stage amplifier circuit is coupled to the first stage amplifier circuit for receiving the first amplified signal and amplifying the first amplified signal to generate a first output signal at a first output node. The first feedforward circuit is coupled between the first input node and the second stage amplifier circuit for feeding the first input signal forward to the second stage amplifier circuit.

19 Claims, 4 Drawing Sheets

OPERATIONAL AMPLIFIER CIRCUITS

CROSS REFERENCE TO RELATED APPLICATIONS

This application claims the benefit of U.S. Provisional Application No. 61/596,356 filed 2012 Feb. 8, the entire contents of which are hereby incorporated by reference.

BACKGROUND OF THE INVENTION

1. Field of the Invention

The invention relates to a high-speed operational amplifier circuit, and more particularly to a high-speed operational amplifier circuit having high linearity and design freedom.

2. Description of the Related Art

Using high-speed operational amplifier is a trend in high-frequency (for example, several GHz) applications. When designing a high-speed operational amplifier, transconductance(s) may be used in the operational amplifier circuit to extend operation bandwidth of the operational amplifier. However, it may be power inefficient for an application bandwidth larger than several GHz since the parasitic poles may cause the operational amplifier to become unstable and more current may be needed to stabilize it.

Since using the high-speed operational amplifier is a trend in high-frequency (for example, several GHz) applications, a novel high-speed operational amplifier circuit which is more stable and has lower power consumption than the conventional designs, and which further has high linearity and design freedom, is highly desired.

BRIEF SUMMARY OF THE INVENTION

Operational amplifier circuits are provided. An exemplary embodiment of an operational amplifier circuit comprises a first stage amplifier circuit, a second stage amplifier circuit, and a first feedforward circuit. The first stage amplifier circuit is coupled to an input node for receiving an input signal and amplifying the input signal to generate an amplified signal. The second stage amplifier circuit is coupled to the first stage amplifier circuit for receiving the amplified signal and amplifying the amplified signal to generate an output signal at an output node. The first feedforward circuit is coupled between the input node and the second stage amplifier circuit for feeding the input signal forward to the second stage amplifier circuit.

Another exemplary embodiment of an operational amplifier circuit comprises a first stage amplifier circuit, a second stage amplifier circuit, a first feedforward circuit and a second feedforward circuit. The first stage amplifier circuit is coupled to a first input node and a second input node for receiving a first input signal and a second input signal, amplifying the first input signal to generate a first amplified signal and amplifying the second input signal to generate a second amplified signal. The second stage amplifier circuit is coupled to the first stage amplifier circuit for receiving and amplifying the first amplified signal and the second amplified signal to generate a first output signal at a first output node and a second output signal at a second output node. The second stage amplifier circuit comprises a first transistor coupled between an operating voltage and the first output node, a second transistor coupled between the first output node and a ground, a third transistor coupled between the operating voltage and the second output node, and a fourth transistor coupled between the second output node and the ground. The first feedforward circuit is coupled between the first input node and a gate of the second transistor for feeding the first input signal forward to the gate of the second transistor. The second feedforward circuit is coupled between the second input node and a gate of the fourth transistor for feeding the second input signal forward to the gate of the fourth transistor.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
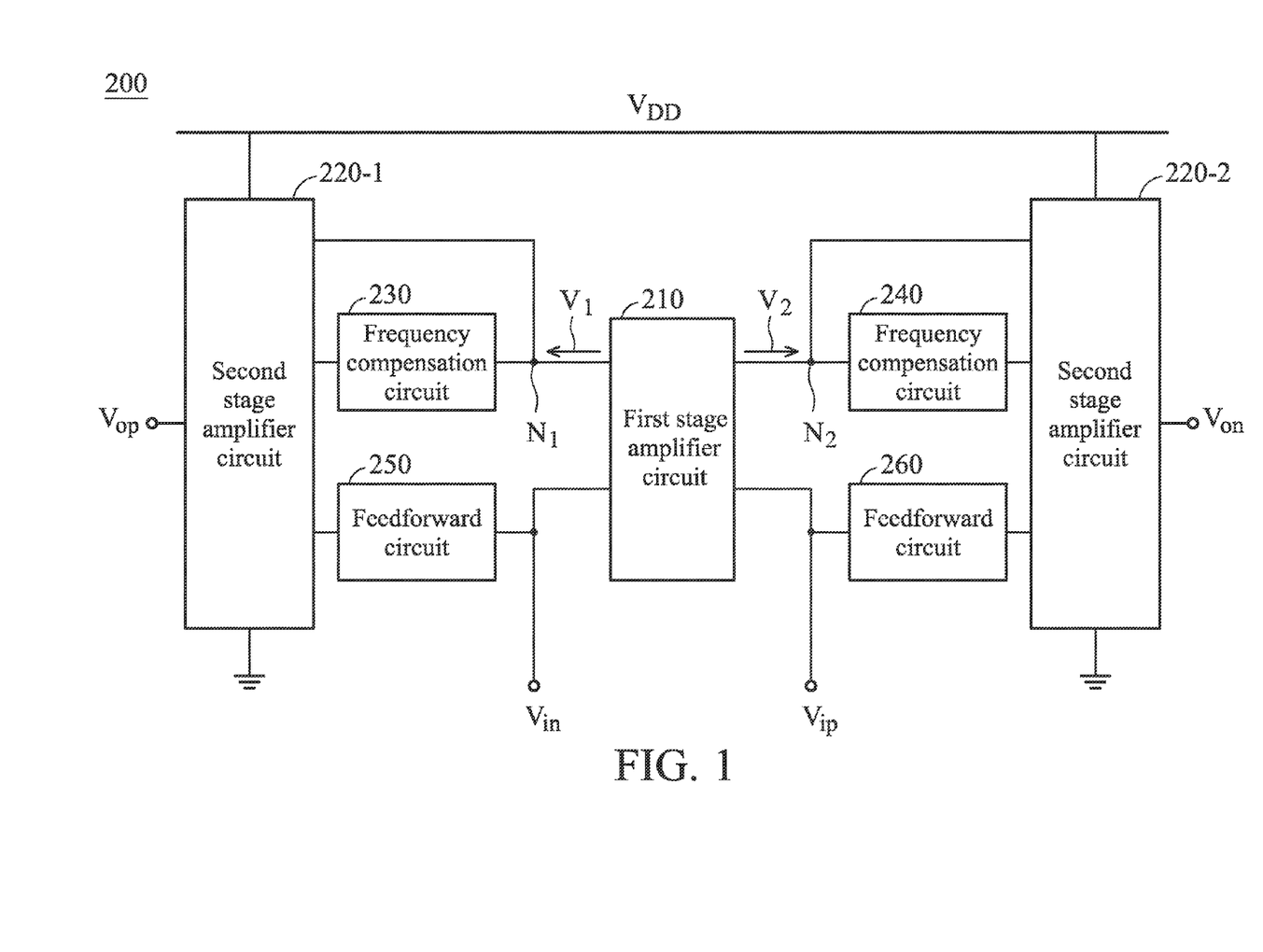
FIG. 1 shows a block diagram of an operational amplifier circuit according to an embodiment of the invention.

FIG. 1 shows a block diagram of an operational amplifier circuit according to an embodiment of the invention. According to an embodiment of the invention, the operational amplifier circuit 200 may comprise at least two stage amplifier circuits and frequency compensation circuits. The first stage amplifier circuit 210 may be coupled to a pair of differential input nodes of the operational amplifier circuit 200 for receiving a pair of differential input signals $V_{in}$ and $V_{ip}$ and amplifying the pair of differential input signals $V_{in}$ and $V_{ip}$ to generate amplified signals $V_1$ and $V_2$ respectively at nodes $N_1$ and $N_2$. The second stage amplifier circuit may comprise two circuit subunits 220-1 and 220-2 and may be coupled to the first stage amplifier circuit 210 at the nodes $N_1$ and $N_2$ for receiving the amplified signals $V_1$ and $V_2$ from the first stage amplifier circuit 210 and further amplifying amplified signals $V_1$ and $V_2$ to respectively generate the output signals $V_{op}$ and $V_{on}$, which may be a pair of differential output signals, at the output nodes of the operational amplifier circuit 200. The frequency compensation circuits 230 and 240 may be operative to perform miller compensation for the frequency response of the operational amplifier circuit 200.

According to an embodiment of the invention, the operational amplifier circuit 200 may further comprise two feedforward circuits 250 and 260, each being coupled between one of the input nodes of the operational amplifier circuit 200 and the second stage amplifier circuit for providing a feedforward path therebetween. Via the feedforward circuits 250 and 260, the pair of differential input signals $V_{in}$ and $V_{ip}$ may be directly fed forward to the second stage amplifier circuit, which in the embodiment of the invention is the last stage amplifier circuit connected to the output nodes of the operational amplifier circuit 200. According to an embodiment of the invention, feeding the input forward to the output may introduce one or more extra zeros in the overall transfer function of the operational amplifier circuit 200. The extra zeros can be utilized to cancel the poles in the overall transfer function of the operational amplifier circuit 200. Therefore, introducing extra zeros can reduce the equivalent stages of the operational amplifier circuit 200. The reduction of equivalent stages helps to stabilize the operational amplifier circuit 200 and may further extend the operation bandwidth of the operational amplifier circuit 200. Eventually, the order at high frequency of the operational amplifier circuit is reduced to one, which manifests itself as a powerful structure for high frequency application since the stability is easy to be handled. According to the embodiments of the invention, the operational amplifier circuit 200 with the feedforward circuits may be designed as a class A amplifier or a class AB amplifier. Exemplary circuit diagrams of the proposed operational amplifier circuit will be discussed in detail in the following paragraphs.

Figure 2:
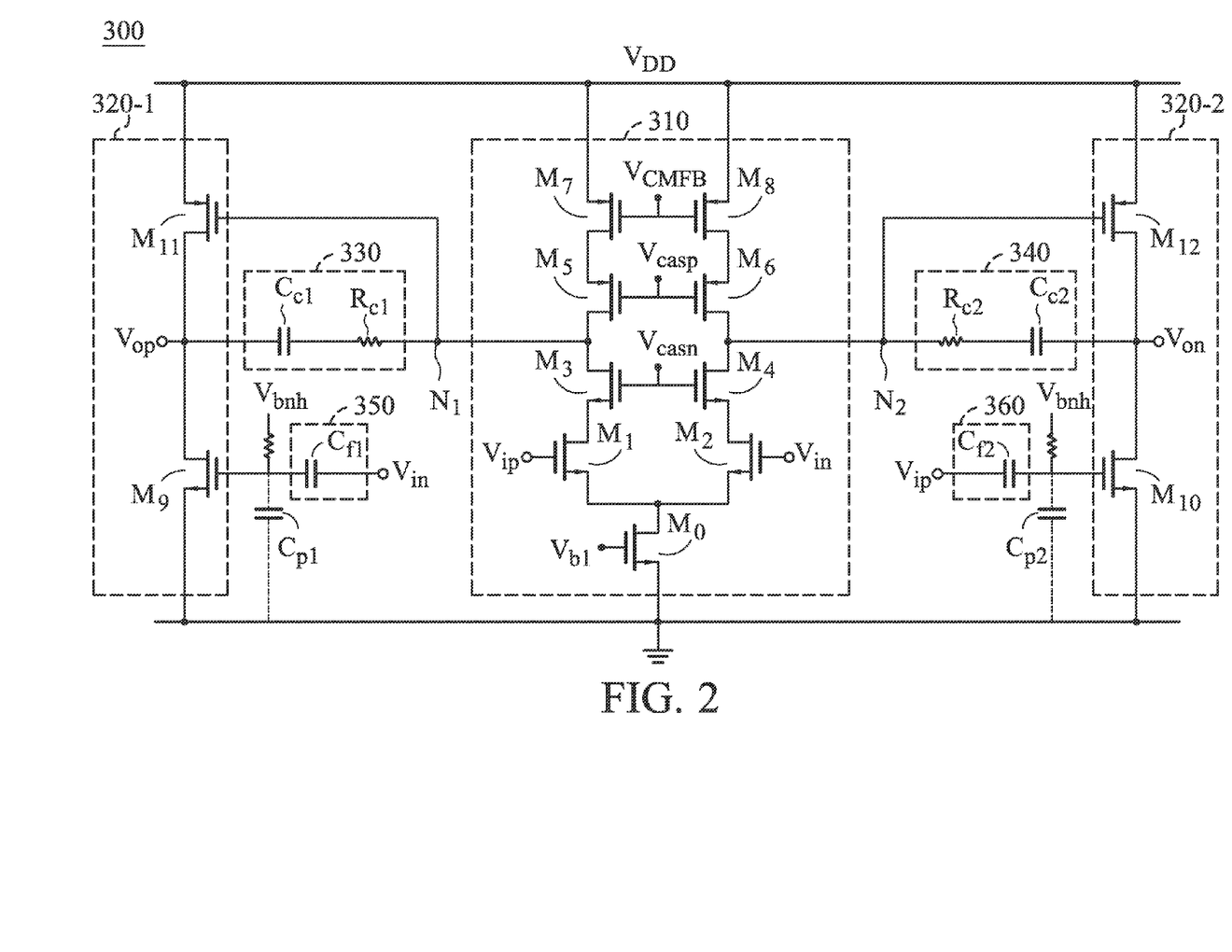
FIG. 2 shows an exemplary circuit diagram of an operational amplifier circuit according to an embodiment of the invention.

FIG. 2 shows an exemplary circuit diagram of an operational amplifier circuit according to an embodiment of the invention. According to the embodiment of the invention, the operational amplifier circuit 300 may comprise at least two stage amplifier circuits 310 and 320-1 and 320-2, frequency compensation circuits 330 and 340, and feedforward circuits 350 and 360. The first stage amplifier circuit 310 may be coupled to a pair of differential input nodes of the operational amplifier circuit 300 for receiving a pair of differential input signals $V_{in}$ and $V_{ip}$ and amplifying the pair of differential input signals to respectively generate amplified signals at nodes $N_1$ and $N_2$. The first stage amplifier circuit 310 may comprise a plurality of transistors $M_0 \sim M_8$. The transistor $M_0$ may be coupled to a bias voltage $V_{b1}$. The pair of transistors $M_1$ and $M_2$ may be coupled to the input nodes of the operational amplifier circuit 300 for receiving the input signals $V_{in}$ and $V_{ip}$. The pair of transistors $M_3$ and $M_4$ may be coupled to a bias voltage $V_{casn}$. The pair of transistors $M_5$ and $M_6$ may be coupled to a bias voltage $V_{casp}$. The pair of transistors $M_7$ and $M_8$ may be coupled to a bias voltage $V_{CMFB}$, which is utilized to set the output common mode voltages of $V_{op}$ and $V_{on}$ The second stage amplifier circuit may comprise two circuit subunits 320-1 and 320-2 respectively coupled to the first stage amplifier circuit 310 at the nodes $N_1$ and $N_2$ for receiving the amplified signals from the first stage amplifier circuit 310 and further amplifying the amplified signals to respectively generate the output signals $V_{op}$ and $V_{on}$ at the output nodes of the operational amplifier circuit 300. The circuit subunit 320-1 of the second stage amplifier circuit may comprise transistors $M_9$ and $M_{11}$ and the circuit subunit 320-2 of the second stage amplifier circuit may comprise transistors $M_{10}$ and $M_{12}$. The transistor $M_{11}$ may be coupled between an operating voltage $V_{DD}$ and a first output node outputting the output signal $V_{op}$. The transistor $M_9$ may be coupled between the first output node and a ground. The transistor $M_{12}$ may be coupled between the operating voltage $V_{DD}$ and a second output node outputting the output signal $V_{on}$. The transistor $M_{10}$ may be coupled between the second output node and the ground. According to an embodiment of the invention, the output signals $V_{op}$ and $V_{on}$ may be a pair of differential output signals.

The frequency compensation circuit 330 may comprise a capacitor $C_{C1}$ and a resistor $R_{C1}$ coupled in serial between the node $N_1$ and the first output node of the operational amplifier circuit 300 for performing miller compensation. The frequency compensation circuit 340 may comprise a capacitor $C_{C2}$ and a resistor $R_{C2}$ coupled in serial between the node $N_2$ and the second output node of the operational amplifier circuit 300 for performing miller compensation.

The feedforward circuit 350 may comprise a feedforward capacitor $C_{f1}$ with a first terminal coupled to a second input node receiving the input signal $V_{in}$ and a second terminal coupled to a gate of the transistor $M_9$. According to an embodiment of the invention, the input signal $V_{in}$ is fed to the gate of the transistor $M_9$ via the feedforward capacitor $C_{f1}$. The feedforward circuit 360 may comprise a feedforward capacitor $C_{f2}$ with a first terminal coupled to a first input node receiving the input signal $V_{ip}$ and a second terminal coupled to a gate of the transistor $M_{10}$. According to an embodiment of the invention, the input signal $V_{ip}$ is fed to the gate of the transistor $M_{10}$ via the feedforward capacitor $C_{f2}$. According to an embodiment of the invention, the gate of the transistors $M_9$ and $M_{10}$ may be further coupled to a bias voltage $V_{bnh}$ and the capacitors $C_{p1}$ and $C_{p2}$ at the gate of the transistors $M_9$ and $M_{10}$ are the parasitic capacitors.

As previously described, feeding the input forward to the output may introduce extra zeros in the overall transfer function of the operational amplifier circuit 300. The extra zeros can be utilized to cancel the poles in the overall transfer function of the operational amplifier circuit 300. Therefore, introducing extra zeros can reduce the equivalent stages of the operational amplifier circuit 300. The reduction of equivalent stages helps to stabilize the operational amplifier circuit 300 and may further extend the operation bandwidth of the operational amplifier circuit 300. In addition, in the embodiments of the invention, because there are only four transistors in the second stage amplifier circuit, in which transistors $M_9$ and $M_{10}$ receiving the fed-forward input signals $V_{in}$ and $V_{ip}$ are directly coupled to the ground, voltage swing will not be limited by the headroom of the transistors that are coupled to the source of the transistors $M_9$ and $M_{10}$. In other words, in the proposed operational amplifier circuit as shown in FIG. 2, there is no extra transistor, which may conventionally be utilized to provide appropriate common mode voltages for the output nodes $V_{op}$ and $V_{on}$, coupled to the source of the transistors $M_9$ and $M_{10}$. Instead, the common mode voltages are determined by the transistors $M_7$ and $M_8$ through the adjusting mechanism of bias voltage $V_{CMFB}$. Therefore, linearity of the proposed operational amplifier circuit 300 as shown in FIG. 2 can be greatly improved because there is only one device coupled between output node and $V_{DD}$ or that and ground.

In addition, the operation bandwidth of the operational amplifier circuit 300 may further be extended by making adjustment in the following three ways: 1) decreasing the capacitance of the capacitor $C_{C1}$ and/or $C_{C2}$ of the frequency compensation circuit(s), 2) increasing the current flowing through the transistors $M_9 \sim M_{12}$ of the second stage amplifier circuit, and 3) increasing the current flowing through the transistors $M_0$, $M_1$ and $M_2$ of the first stage amplifier circuit. Because the designer may flexibly choose one or more adjustments to the capacitance and/or current to extend the operation bandwidth, the design freedom for bandwidth control can also be greatly improved as compared to conventional operational amplifier designs.

Figure 3:
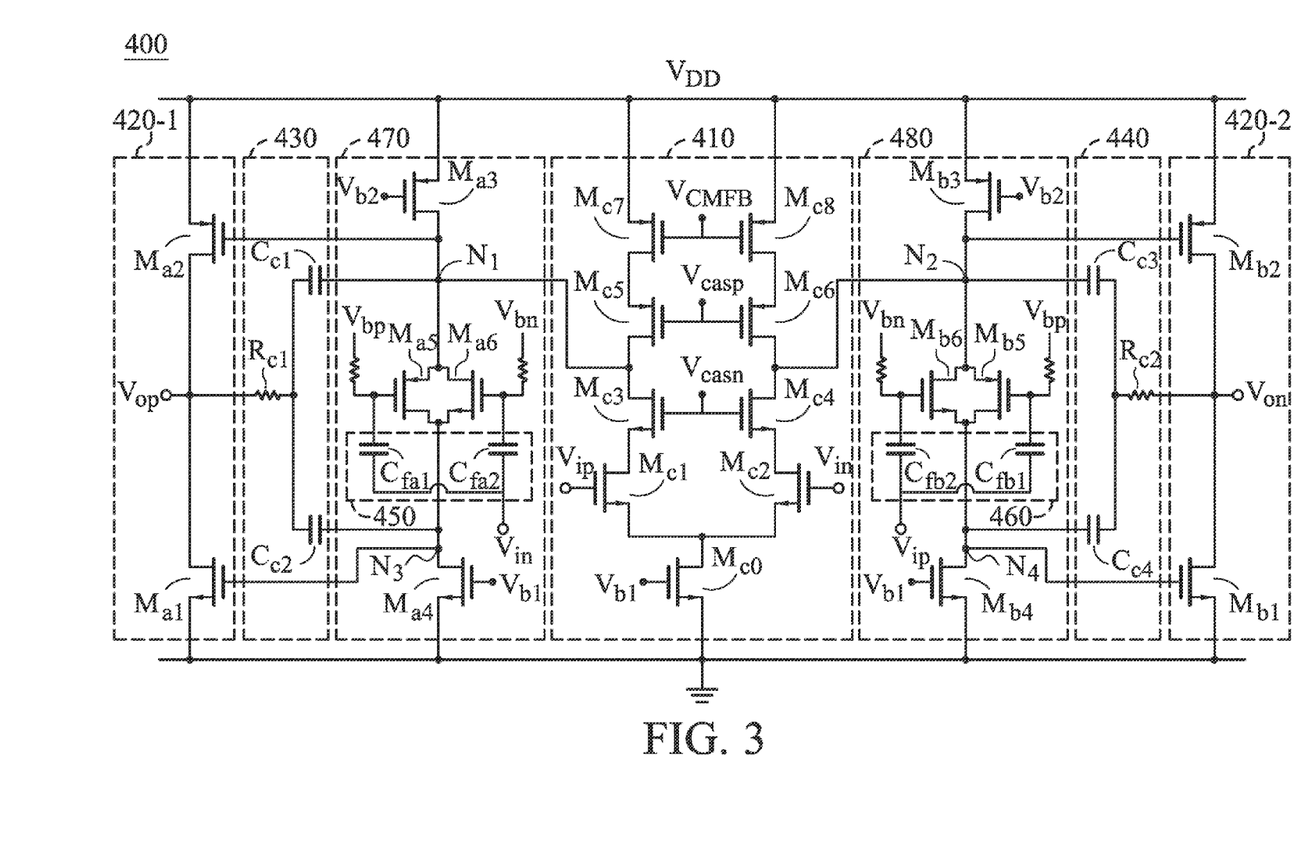
FIG. 3 shows an exemplary circuit diagram of an operational amplifier circuit according to another embodiment of the invention.

FIG. 3 shows an exemplary circuit diagram of an operational amplifier circuit according to another embodiment of the invention. According to the embodiment of the invention, the operational amplifier circuit 400 may comprise at least two stage amplifier circuits 410 and 420-1 and 420-2, frequency compensation circuits 430 and 440, and feedforward circuits 450 and 460. The first stage amplifier circuit 410 may be coupled to a pair of differential input nodes of the operational amplifier circuit 400 for receiving a pair of differential input signals $V_{in}$ and $V_{ip}$ and amplifying the pair of differential input signals to respectively generate amplified signals at nodes $N_1$ and $N_2$. The first stage amplifier circuit 410 may comprise a plurality of transistors $M_{c0}$~$M_{c8}$. The transistor $M_{c0}$ may be coupled to a bias voltage $V_{b1}$. The pair of transistors $M_{c1}$ and $M_{c2}$ may be coupled to the input nodes of the operational amplifier circuit 400 for receiving the input signals $V_{in}$ and $V_{ip}$. The pair of transistors $M_{c3}$ and $M_{c4}$ may be coupled to a bias voltage $V_{casn}$. The pair of transistors $M_{c5}$ and $M_{c6}$ may be coupled to a bias voltage $V_{casp}$. The pair of transistors $M_{c7}$ and $M_{c8}$ may be coupled to a bias voltage $V_{CMFB}$.

The second stage amplifier circuit may comprise two circuit subunits 420-1 and 420-2 respectively coupled to the first stage amplifier circuit 410 at the nodes $N_1$ and $N_2$ for receiving the amplified signals from the first stage amplifier circuit 410 and further amplifying the amplified signals to respectively generate the output signals $V_{op}$ and $V_{on}$ at the output nodes of the operational amplifier circuit 400. The circuit subunit 420-1 of the second stage amplifier circuit may comprise transistors $M_{a1}$ and $M_{a2}$, and the circuit subunit 420-2 of the second stage amplifier circuit may comprise transistors $M_{b1}$ and $M_{b2}$. The transistor $M_{a2}$ may be coupled between an operating voltage $V_{DD}$ and a first output node outputting the output signal $V_{op}$. The transistor $M_{a1}$ may be coupled between the first output node and a ground. The transistor $M_{b2}$ may be coupled between the operating voltage $V_{DD}$ and a second output node outputting the output signal $V_{on}$. The transistor $M_{b1}$ may be coupled between the second output node and the ground. According to an embodiment of the invention, the output signals $V_{op}$ and $V_{on}$ may be a pair of differential output signals.

The frequency compensation circuit 430 may be coupled between the first stage amplifier circuit 410 and the first output node and may comprise capacitors $C_{C1}$ and $C_{C2}$ and a resistor $R_{C1}$ for performing miller compensation. The frequency compensation circuit 440 may be coupled between the first stage amplifier circuit 410 and the second output node and may comprise capacitors $C_{C3}$ and $C_{C4}$ and a resistor $R_{C2}$ for performing miller compensation.

The feedforward circuit 450 may comprise two feedforward capacitors $C_{fa1}$ and $C_{fa2}$. The feedforward circuit 460 may comprise two feedforward capacitors $C_{fb1}$ and $C_{fb2}$. According to an embodiment of the invention, the operational amplifier circuit 400 may further comprise two class AB controlling circuits 470 and 480, which comprise static biasing transistors $M_{a3}$, $M_{a4}$, $M_{b3}$, and $M_{b4}$ and dynamic biasing transistors $M_{a5}$, $M_{a6}$, $M_{b5}$, and $M_{b6}$ for forwarding the inputs to the second stage, dynamic biasing transistors $M_{a5}$, $M_{a6}$, $M_{b5}$, and $M_{b6}$ also act as the source follower input, which is favorable for high frequency application, and incur no noticeable stability degradation. The controlling circuit 470 which acts as a source follower in this embodiment may comprise a P-type source follower formed by transistors $M_{a3}$ and $M_{a5}$ and an N-type source follower formed by transistors $M_{a4}$ and $M_{a6}$. The controlling circuit 480 which acts as a source follower in this embodiment may comprise a P-type source follower formed by transistors $M_{b3}$ and $M_{b5}$ and an N-type source follower formed by transistors $M_{b4}$ and $M_{b6}$.

According to an embodiment of the invention, a first terminal of the feedforward capacitor $C_{fa1}$ may be coupled to the second input node of the operational amplifier circuit 400 for receiving the input signal $V_{in}$ and a second terminal of the feedforward capacitor $C_{fa1}$ may be coupled to a gate of an input transistor $M_{a5}$ of the P-type source follower formed by transistors $M_{a3}$ and $M_{a5}$. The output terminal of the P-type source follower formed by transistors $M_{a3}$ and $M_{a5}$ may be coupled to a gate of the transistor $M_{a2}$ of the second stage amplifier circuit at node $N_1$. In addition, a first terminal of the feedforward capacitor $C_{fa2}$ may also be coupled to the second input node of the operational amplifier circuit 400 for receiving the input signal $V_{in}$ and a second terminal of the feedforward capacitor $C_{fa2}$ may be coupled to a gate of an input transistor $M_{a6}$ of the N-type source follower formed by transistors $M_{a4}$ and $M_{a6}$. The output terminal of the N-type source follower formed by transistors $M_{a4}$ and $M_{a6}$ may be coupled to a gate of the transistor $M_{a1}$ of the second stage amplifier circuit at node $N_3$.

Similarly, a first terminal of the feedforward capacitor $C_{fb1}$ may be coupled to the first input node of the operational amplifier circuit 400 for receiving the input signal $V_{ip}$ and a second terminal of the feedforward capacitor $C_{fb1}$ may be coupled to a gate of an input transistor $M_{b5}$ of the P-type source follower formed by transistors $M_{b3}$ and $M_{b5}$. The output terminal of the P-type source follower formed by transistors $M_{b3}$ and $M_{b5}$ may be coupled to a gate of the transistor $M_{b2}$ of the second stage amplifier circuit at node $N_2$. In addition, a first terminal of the feedforward capacitor $C_{fb2}$ may also be coupled to the first input node of the operational amplifier circuit 400 for receiving the input signal $V_{ip}$ and a second terminal of the feedforward capacitor $C_{fb2}$ may be coupled to a gate of an input transistor $M_{b6}$ of the N-type source follower formed by transistors $M_{b4}$ and $M_{b6}$. The output terminal of the N-type source follower formed by transistors $M_{b4}$ and $M_{b6}$ may be coupled to a gate of the transistor $M_{b1}$ of the second stage amplifier circuit at node $N_4$.

According to an embodiment of the invention, because the input terminal of the P-type source follower formed by transistors $M_{a3}$ and $M_{a5}$ is coupled to the feedforward capacitor $C_{fa1}$ for receiving the input signal $V_{in}$ therethrough and the output terminal of the P-type source follower is coupled to the gate of the transistor $M_{a2}$ at node $N_1$, the input signal $V_{in}$ can be fed to the gate of the transistor $M_{a2}$ via the feedforward capacitor $C_{fa1}$ and the P-type source follower. In addition, because the input terminal of the N-type source follower formed by transistors $M_{a4}$ and $M_{a6}$ is coupled to the feedforward capacitor $C_{fa2}$ for receiving the input signal $V_{in}$ therethrough and the output terminal of the N-type source follower is coupled to the gate of the transistor $M_{a1}$ at node $N_3$, the input signal $V_{in}$ can also be fed to the gate of the transistor $M_{a1}$ via the feedforward capacitor $C_{fa2}$ and the N-type source follower.

Similarly, according to an embodiment of the invention, because the input terminal of the P-type source follower formed by transistors $M_{b3}$ and $M_{b5}$ is coupled to the feedforward capacitor $C_{fb1}$ for receiving the input signal $V_{ip}$ therethrough and the output terminal of the P-type source follower is coupled to the gate of the transistor $M_{b2}$ at node $N_2$, the input signal $V_{ip}$ can be fed to the gate of the transistor $M_{b2}$ via the feedforward capacitor $C_{fb1}$ and the P-type source follower. In addition, because the input terminal of the N-type source follower formed by transistors $M_{b4}$ and $M_{b6}$ is coupled to the feedforward capacitor $C_{fb2}$ for receiving the input signal $V_{ip}$ therethrough and the output terminal of the N-type source follower is coupled to the gate of the transistor $M_{b1}$ at node $N_4$, the input signal $V_{ip}$ can also be fed to the gate of the transistor $M_{b1}$ via the feedforward capacitor $C_{fb2}$ and the N-type source follower.

According to an embodiment of the invention, the gate of the transistor $M_{a5}$ and the gate of the transistor $M_{b5}$ may be further coupled to a bias voltage $V_{bp}$ and the gate of the transistor $M_{a6}$ and the gate of the transistor $M_{b6}$ may be further coupled to a bias voltage $V_{bn}$. In addition, the gate of the transistor $M_{a4}$ and the gate of the transistor $M_{b4}$ may be coupled to the bias voltage $V_{b1}$ and the gate of the transistor $M_{a3}$ and the gate of the transistor $M_{b3}$ may be coupled to a bias voltage $V_{b2}$. Note that according to some embodiments of the invention, the source follower circuits (e.g., the class AB controlling circuits 470 and 480) may be integrated in the first stage amplifier circuit 410 to become a portion of the first stage amplifier and therefore the invention should not be limited thereto.

As previously described, feeding the input forward to the output may introduce extra zeros in the overall transfer function of the operational amplifier circuit 400. The extra zeros can be utilized to cancel the poles in the overall transfer function of the operational amplifier circuit 400. Therefore, introducing extra zeros can reduce the equivalent stages of the operational amplifier circuit 400. The reduction of equivalent stages helps to stabilize the operational amplifier circuit 400 and may further extend the operation bandwidth of the operational amplifier circuit 400. In addition, in the embodiments of the invention, because there are only four transistors in the second stage amplifier circuit, in which the transistors $M_{a1}$ and $M_{b1}$ receiving the fed-forward input signals $V_{in}$ and $V_{ip}$ are directly coupled to the ground, voltage swing will not be limited by the headroom of the transistors that are coupled to the source of the transistors $M_{a1}$ and $M_{b1}$. In other words, in the proposed operational amplifier circuit as shown in FIG. 3, there is no extra transistor, which may conventionally utilized to provide appropriate common mode voltages for the output nodes $V_{op}$ and $V_{on}$, coupled to the source of the transistors $M_{a1}$ and $M_{b1}$. Instead, the common mode voltages are determined by the transistors $M_{c7}$ and $M_{c8}$ through the adjusting mechanism of bias voltage $V_{CMFB}$. Therefore, linearity of the proposed operational amplifier circuit 400 as shown in FIG. 3 can be greatly improved because there is only one device coupled between output node and $V_{DD}$ or that and ground.

In addition, the operation bandwidth of the operational amplifier circuit 400 may be further extended by making adjustments in the following three ways: 1) decreasing the capacitance of the capacitor $C_{C1}$, $C_{C2}$, $C_{C3}$ and/or $C_{C4}$ in the frequency compensation circuit(s), 2) increasing the current flowing through the transistors $M_{a1}$, $M_{a2}$, $M_{b1}$ and/or $M_{b2}$ of the second stage amplifier circuit, and 3) increasing the current flowing through the transistors $M_{c0}$, $M_{c1}$ and $M_{c2}$ of the first stage amplifier circuit. Because the designer may flexibly choose one or more adjustments to the capacitance and/or current to extend the operation bandwidth, the design freedom for bandwidth control can also be greatly improved as compared to conventional operational amplifier designs.

Figure 4:
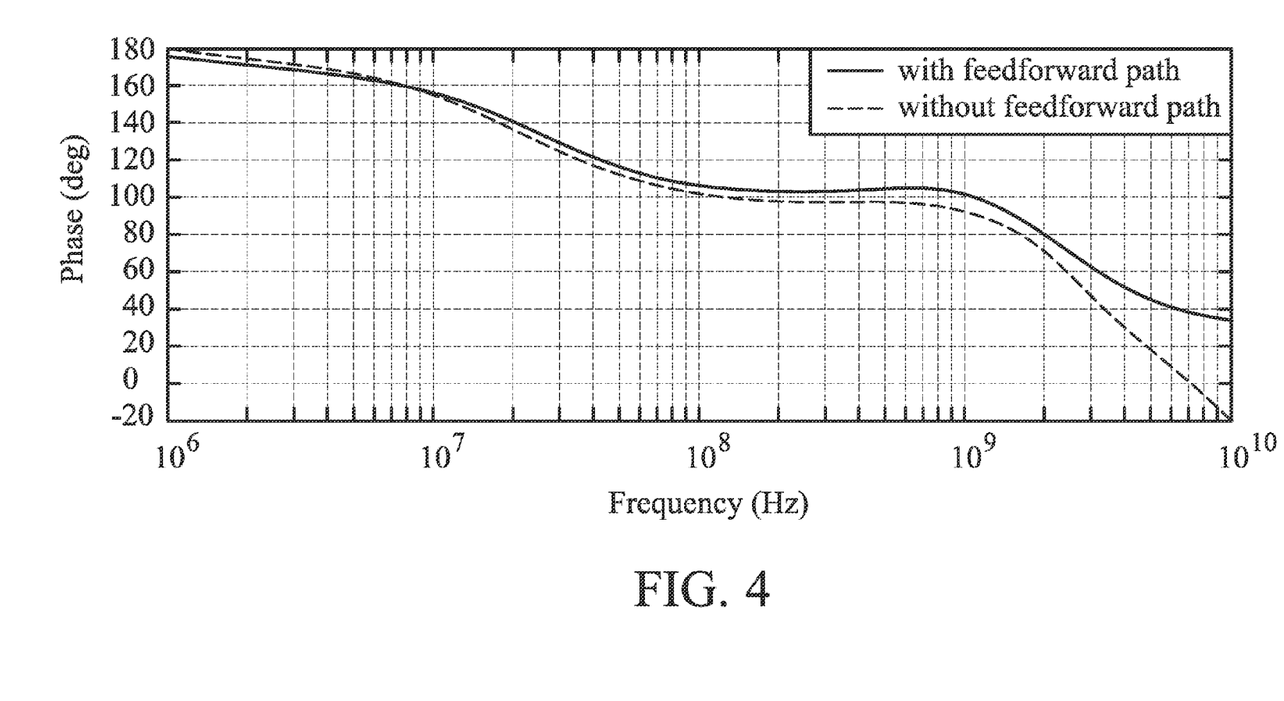
FIG. 4 shows a simulated phase margin of an operational amplifier circuit with and without the proposed feedforward path according to an embodiment of the invention.

FIG. 4 shows a simulated phase margin of an operational amplifier circuit with and without the proposed feedforward path according to an embodiment of the invention. As shown in FIG. 4, the simulated phase margin of an operational amplifier circuit with the proposed feedforward path can be dramatically improved as compared to a conventional two stage operational amplifier, especially in the high frequency area, due to the ac coupling path(s) provided by the feedforward circuit(s). Therefore, the proposed operational amplifier circuits serve as good candidates to achieve high linearity and the design flexibility, as previously described, is high in high-frequency applications.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An operational amplifier circuit, comprising:
   a first stage amplifier circuit, coupled to a first input node for receiving a first input signal and amplifying the first input signal to generate a first amplified signal;
   a second stage amplifier circuit, coupled to the first stage amplifier circuit for receiving the first amplified signal and amplifying the first amplified signal to generate a first output signal at a first output node;
   a first feedforward circuit, coupled between the first input node and the second stage amplifier circuit for feeding the first input signal forward to the second stage amplifier circuit; and
   a first controlling circuit, comprising:
   a first source follower, comprising a first terminal coupled to the first feedforward circuit for receiving the first input signal from the first feedforward circuit.

2. The operational amplifier circuit as claimed in claim 1, wherein the first stage amplifier circuit is further coupled to a second input node for receiving a second input signal and amplifying the second input signal to generate a second amplified signal, the second stage amplifier circuit further receives the second amplified signal and amplifies the second amplified signal to generate a second output signal at a second output node, and wherein the first input signal and the second input signal are a pair of differential input signals and the first output signal and the second output signal are a pair of differential output signals.

3. The operational amplifier circuit as claimed in claim 2, further comprising a second feedforward circuit coupled between the second input node and the second stage amplifier circuit for feeding the second input signal forward to the second stage amplifier circuit.

4. The operational amplifier circuit as claimed in claim 1, wherein the second stage amplifier circuit comprises a first circuit subunit for receiving the first amplified signal and amplifying the first amplified signal, and the first circuit subunit comprises:
   a first transistor, coupled between an operating voltage and the first output node; and
   a second transistor, coupled between the first output node and a ground,
   wherein the first input signal is fed to at least one of a gate of the first transistor and a gate of the second transistor.

5. The operational amplifier circuit as claimed in claim 3, wherein the second stage amplifier circuit comprises a second circuit subunit for receiving the second amplified signal and amplifying the second amplified signal, and the second circuit subunit comprises:
   a third transistor, coupled between an operating voltage and the second output node; and
   a fourth transistor, coupled between the second output node and a ground,
   wherein the second input signal is fed to at least one of a gate of the third transistor and a gate of the fourth transistor.

6. The operational amplifier circuit as claimed in claim 4, wherein the first feedforward circuit comprises a first feedforward capacitor having a first terminal coupled to the first input node and a second terminal coupled to the gate of the second transistor.

7. The operational amplifier circuit as claimed in claim 5, wherein the second feedforward circuit comprises a second feedforward capacitor having a first terminal coupled to the second input node and a second terminal coupled to the gate of the fourth transistor.

8. The operational amplifier circuit as claimed in claim 4, wherein the first source follower further comprises a second terminal coupled to one of the gates, of either the first transistor or the second transistor, and wherein the first controlling circuit further comprises:
a second source follower, comprising a first terminal coupled to the first feedforward circuit for receiving the first input signal from the first feedforward circuit and a second terminal coupled to the other gate, of either the first transistor or the second transistor,
wherein the first input signal is fed to the gate of the first transistor and the gate of the second transistor through the first source follower and the second source follower.

9. The operational amplifier circuit as claimed in claim 8, wherein the first feedforward circuit comprises a first feedforward capacitor having a first terminal coupled to the first input node and a second terminal coupled to a gate of an input transistor of the first source follower and a second feedforward capacitor having a first terminal coupled to the first input node and a second terminal coupled to a gate of an input transistor of the second source follower.

10. The operational amplifier circuit as claimed in claim 8, wherein the first controlling circuit is comprised in the first stage amplifier circuit.

11. The operational amplifier circuit as claimed in claim 5, further comprising a second controlling circuit, wherein the second controlling circuit comprises:
a third source follower, comprising a first terminal coupled to the second feedforward circuit for receiving the second input signal from the second feedforward circuit and a second terminal coupled to one of the gates of either the third transistor or the fourth transistor; and
a fourth source follower, comprising a first terminal coupled to the second feedforward circuit for receiving the second input signal from the second feedforward circuit and a second terminal coupled to the other gate of either the third transistor or the fourth transistor,
wherein the second input signal is fed to the gate of the third transistor and the gate of the fourth transistor through the third source follower and the fourth source follower.

12. The operational amplifier circuit as claimed in claim 11, wherein the second feedforward circuit comprises a third feedforward capacitor having a first terminal coupled to the second input node and a second terminal coupled to a gate of an input transistor of the third source follower and a fourth feedforward capacitor having a first terminal coupled to the second input node and a second terminal coupled to a gate of an input transistor of the fourth source follower.

13. The operational amplifier circuit as claimed in claim 11, wherein the second controlling circuit is comprised in the first stage amplifier circuit.

14. An operational amplifier circuit, comprising:
a first stage amplifier circuit, coupled to a first input node and a second input node for receiving a first input signal and a second input signal, amplifying the first input signal to generate a first amplified signal and amplifying the second input signal to generate a second amplified signal;
a second stage amplifier circuit, coupled to the first stage amplifier circuit for receiving and amplifying the first amplified signal and the second amplified signal to generate a first output signal at a first output node and a second output signal at a second output node, wherein the second stage amplifier circuit comprises:
a first transistor, coupled between an operating voltage and the first output node;
a second transistor, coupled between the first output node and a ground;
a third transistor, coupled between the operating voltage and the second output node; and
a fourth transistor, coupled between the second output node and the ground;
a first feedforward circuit, coupled between the first input node and a gate of the second transistor for feeding the first input signal forward to the gate of the second transistor;
a second feedforward circuit, coupled between the second input node and a gate of the fourth transistor for feeding the second input signal forward to the gate of the fourth transistor;
a first controlling circuit, comprising a first N-type source follower and a first P-type source follower.

15. The operational amplifier circuit as claimed in claim 14, wherein the first input signal and the second input signal are a pair of differential input signals and the first output signal and the second output signal are a pair of differential output signals.

16. The operational amplifier circuit as claimed in claim 14, wherein the first feedforward circuit comprises a first feedforward capacitor having a first terminal coupled to the first input node and a second terminal coupled to the gate of the second transistor, and the second feedforward circuit comprises a second feedforward capacitor having a first terminal coupled to the second input node and a second terminal coupled to the gate of the fourth transistor.

17. The operational amplifier circuit as claimed in claim 14,
wherein the first feedforward circuit comprises:
a first feedforward capacitor having a first terminal coupled to the first input node and a second terminal coupled to a gate of an input transistor of the first N-type source follower; and
a second feedforward capacitor having a first terminal coupled to the first input node and a second terminal coupled to a gate of an input transistor of the first P-type source follower, and
wherein the first input signal is fed to the gate of the second transistor and further to a gate of the first transistor respectively through the first N-type source follower and the first P-type source follower.

18. The operational amplifier circuit as claimed in claim 17, further comprising:
a second controlling circuit, comprising a second N-type source follower and a second P-type source follower, and
wherein the second feedforward circuit comprises:
a third feedforward capacitor having a first terminal coupled to the second input node and a second terminal coupled to a gate of an input transistor of the second N-type source follower; and
a fourth feedforward capacitor having a first terminal coupled to the second input node and a second terminal coupled to a gate of an input transistor of the second P-type source follower,
wherein the second input signal is fed to the gate of the fourth transistor and further a gate of the third transistor respectively through the second N-type source follower and the second P-type source follower.

19. The operational amplifier circuit as claimed in claim 14, further comprising:
a first frequency compensation circuit, coupled between the first stage amplifier circuit and the first output node for performing miller compensation; and a second frequency compensation circuit, coupled between the first stage amplifier circuit and the second output node for performing miller compensation.

* * * * *